United States Patent [19]

Yee

[11] Patent Number: 5,705,961
[45] Date of Patent: Jan. 6, 1998

[54] INDUCTION DEVICE FOR HIGH RADIO FREQUENCY SIGNAL DISTRIBUTOR

[76] Inventor: Bark-Lee Yee, 203, Shou Chang Road, Kaohsiung, Taiwan

[21] Appl. No.: 625,530

[22] Filed: Mar. 29, 1996

[51] Int. Cl.$^6$ .............................. H03H 7/48; H01F 17/04; H01F 27/30

[52] U.S. Cl. ..................... 333/131; 336/172; 336/182; 336/212; 336/221

[58] Field of Search .............................. 333/119, 131; 336/172, 180, 182, 183, 212, 221, 73, 214, 215

[56] References Cited

U.S. PATENT DOCUMENTS

| | | | |
|---|---|---|---|
| 3,449,704 | 6/1969 | Matsushima et al. | 336/221 |
| 4,052,785 | 10/1977 | Duncan | 336/221 |
| 4,785,273 | 11/1988 | Doty | 336/221 |

Primary Examiner—Thomas J. Kozma
Attorney, Agent, or Firm—David & Raymond; Raymond Y. C. Chan

[57] ABSTRACT

An induction device for high radio frequency signal distributor which is able to act as a right signal distributing induction device on the right side of the high radio frequency signal distributor and act as a left signal distributing induction device on the left side of the high radio frequency signal distributor. Accordingly, the induction device comprises a pair of conductive cores and a plurality of enamel copper wires or insulated copper wires intertwined around the two cores in predetermined manner for accommodating high radio frequency signal distributor so as to enable the transmission frequency range of radio frequency signal distributing circuit to extend to 1000 MHz. Thus the number of channels of cable TV can be increased.

12 Claims, 6 Drawing Sheets

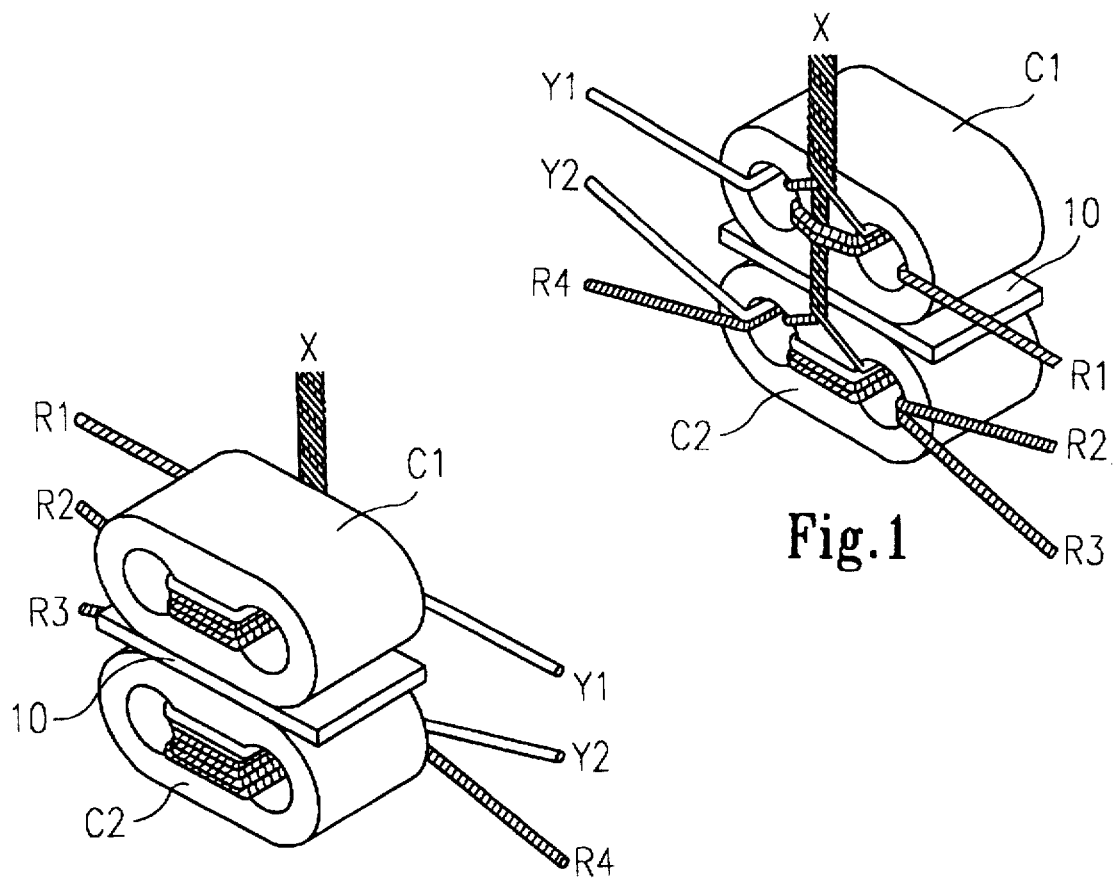
Fig.1
Fig.2
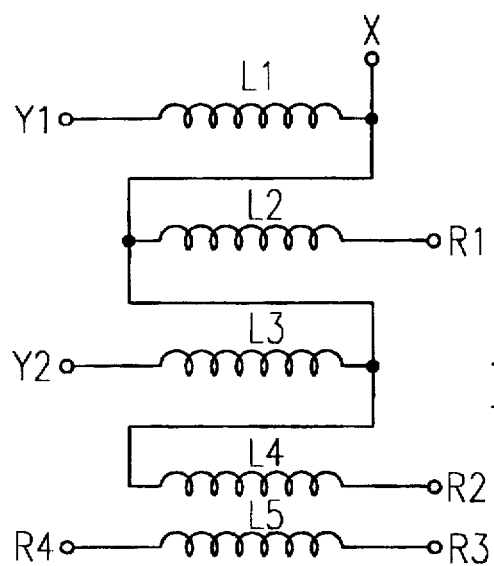
Fig.3

INDUCTION DEVICE FOR HIGH RADIO FREQUENCY SIGNAL DISTRIBUTOR

BACKGROUND OF THE PRESENT INVENTION

The present invention relates to high radio frequency signal distributor, and more particularly to an induction device for high radio frequency signal distributor which enables the transmission frequency of the signal distributor to extend to 1000 MHZ.

In light of the recent growth in the popularity of cable television and the more competitiveness of its market, the factors of quantity and variety of the programs broadcasted by cable TV channels have become determinant for the success of cable TV in the market. Since the quality of service is the key of competition, most of the cable TV companies concentrate their effort in improvement the quality of programs and providing more channels. Therefore, to increase broadcast frequencies for accommodating more channels and improve the quality of the received signals for attracting a greater number of customers are trends of course. To achieve such goals, it is necessary to extend the range of the transmission frequencies of radio frequency signal distributing circuit to as high as 1000 MHz.

Conventional induction device of regular radio frequency signal distributor comprises a pair of intertwined enamel copper wires or insulated copper wires wound on cores made of nickel-zinc-iron alloy. Such induction devices in art may produce unsymmetrical magnetic fields and diffuse electrical capacities. Their frequencies cannot exceed 600 MHz. However, if the frequency of the transmission signals is higher than 600 MHz, the high frequency transmission signals will become unstable and difficult to receive, especially when it needs to be applied to the circuit board (PCB) during mass production.

SUMMARY OF THE PRESENT INVENTION

The main object of the present invention is to provide an induction device for high radio frequency signal distributor which enables the transmission frequency of the signal distributor extending to 1000 MHz.

Another object of the present invention is to provide an induction device for high radio frequency signal distributor which is able to act as a right signal distributing induction device on the right side of the high radio frequency signal distributor and act as a left signal distributing induction device on the left side of the high radio frequency signal distributor. Accordingly, the induction device comprises a pair of conductive cores and a plurality of enamel copper wires or insulated copper wires intertwined around the two cores in predetermined manner for accommodating high radio frequency signal distributor so as to enable the transmission frequency range of radio frequency signal distributing circuit to extend to 1000 MHz. Thus the number of channels of cable TV can be increased.

BRIEF DESCRIPTION OF THE DRAWINGS

FIG. 1 is a front perspective view of a right signal distributing induction device according to a preferred embodiment of the present invention.

FIG. 2 is a rear perspective view of the right signal distributing induction device according to the above preferred embodiment of the present invention.

FIG. 3 is a circuit diagram of the right signal distributing induction device according to the above preferred embodiment of the present invention.

DETAILED DESCRIPTION OF THE PREFERRED EMBODIMENT

Figure 4:
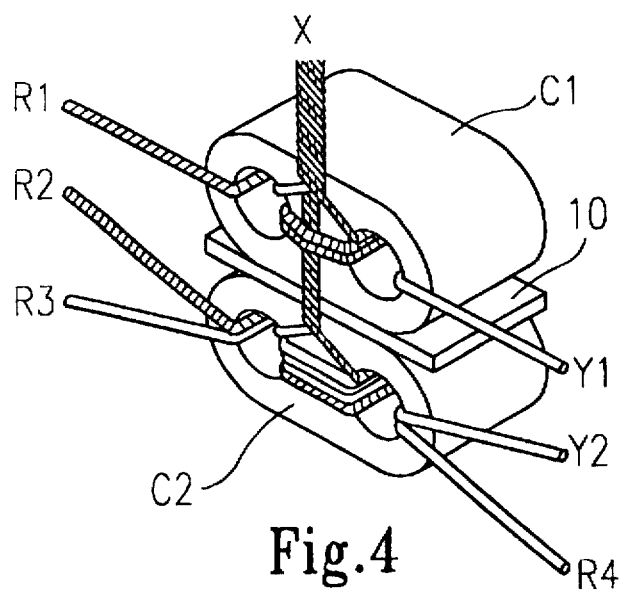
FIG. 4 is a front perspective view of a left signal distributing induction device according to the above preferred embodiment of the present invention.

Referring to FIGS. 1 and 2, an induction device for high radio frequency signal distributor is illustrated as a right signal distributing induction device when it is incorporated on the right side of a high radio frequency signal distributor. The right signal distributing induction device comprises a pair of conductive cores C1, C2, an insulator 10 which is an insulating paper card and a plurality of enamel copper wires (or insulated copper wires) Y1, Y2, R1, R2 and R3.

The two cores C1, C2 have identical configurations that each of the cores C1, C2 has two parallel bores and a winding portion positioned between the two bores. The two cores C1, C2 are symmetrically adhered to the two opposite sides of the insulator 10 by an adhesive, rendering the two cores C1, C2 to form a symmetrical basic structure of the induction device.

Referring to FIGS. 1 to 3, the plurality of enamel copper wires Y1, Y2, R1, R2, and R3 are intertwined around the two cores C1, C2 in specific manner to define a predetermined number of inductors L1, L2, L3, L4, and L5.

In accordance with the present embodiment, the first and second enamel copper wires Y1 and R1 are wound about the winding portion of the first core C1 defining the first and second inductor L1 and L2 and the third, fourth and fifth enamel copper wires Y2, R2 and R3 are wound about the winding portion of the second core C2 defining the third, fourth and fifth inductors L3, L4 and L5, in which the other ends of the first, second, third, and fourth enamel copper wires Y1, R1, Y2, R2, and R3 are twisted together to form a terminal end X.

The first enamel copper wire Y1 penetrates the left bore of the first core C1 and then winds around the winding portion of the first core C1 for 0.5 round with the other end of first wire Y1 intertwining with the terminal end X, and thus the first inductor L1 is formed. The second enamel copper wire R1 penetrates the right bore of the first core C1 and then winds around the winding portion of the first core C1 for 2.5 rounds with the other end of second wire R1 intertwining with the terminal end X, and thus the second inductor L2 is formed. The third enamel copper wire Y2 penetrates the left bore of the second core C2 and then winds around the winding portion of the second core C2 for 1.5 rounds with the other end of third wire Y2 intertwining with the terminal end X, and thus the third inductor L3 is formed. The fourth enamel copper wire R2 penetrates the right bore of the second core C2 and then winds around the winding portion of the second core C2 for 1.5 rounds with the other end of fourth wire R2 intertwining with the terminal end X, and thus the fourth inductor L4 is formed. Lastly, the fifth enamel copper wire R3 penetrates the right bore of the second core C2 and then winds around the winding portion of the second core C2 for 1.5 rounds with the other end R4 of the fifth wire R3 extending out of the second core C2 via its left bore to form the fifth inductor L5.

In accordance with the configuration described above, a right signal distributing induction device having the five inductors L1 to L5 is thus constructed.

Figure 5:
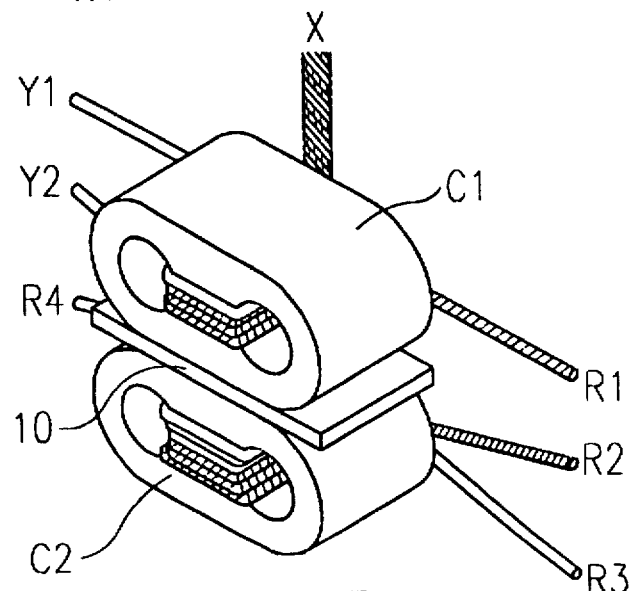
FIG. 5 is a rear perspective view of the left signal distributing induction device according to the above preferred embodiment of the present invention.
Figure 6:
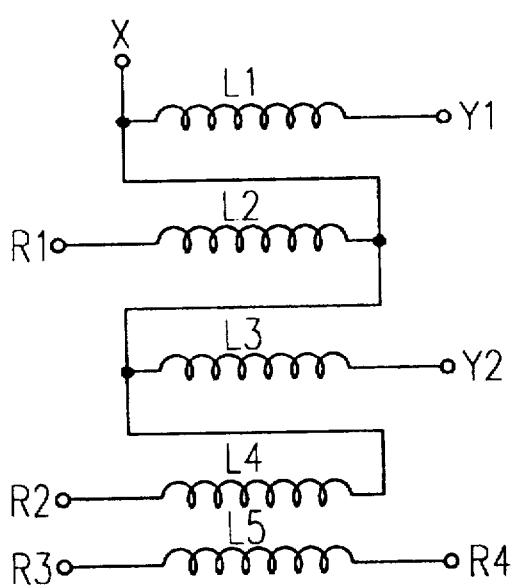
FIG. 6 is a circuit diagram of the left signal distributing induction device according to the above preferred embodiment of the present invention.

Referring to FIGS. 4 to 6, an induction device for high radio frequency signal distributor is illustrated as a left signal distributing induction device when it is incorporated on the left side of a high radio frequency signal distributor. Whereby the identical first and second cores C1, C2 are symmetrically adhered to the two sides of the insulator 10. The first enamel copper wire Y1 penetrates the right bore of the first core C1 and then winds around the winding portion of the first core C1 for 0.5 round with the other end of first wire Y1 intertwining with the terminal end X, and thus the first inductor L1 is formed. The second enamel copper wire R1 penetrates the left bore of the first core C1 and then winds around the winding portion of the first core C1 for 2.5 rounds with the other end of second wire R1 intertwining with the terminal end X, and thus the second inductor L2 is formed. The third enamel copper wire Y2 penetrates the right bore of the second core C2 and then winds around the winding portion of the second core C2 for 1.5 rounds with the other end of third wire Y2 intertwining with the terminal end X, and thus the third inductor L3 is formed. The fourth enamel copper wire R2 penetrates the left bore of the second core C2 and then winds around the winding portion of the second core C2 for 1.5 rounds with the other end of fourth wire R2 intertwining with the terminal end X, and thus the fourth inductor L4 is formed. Lastly, the fifth enamel copper wire R3 penetrates the left bore of the second core C2 and then winds around the winding portion of the second core C2 for 1.5 rounds with the other end R4 of the fifth wire R3 extending out of the second core C2 via its right bore to form the fifth inductor L5.

In accordance with the configuration described above, a left signal distributing induction device having the five inductors L1 to L5 is thus constructed. In fact, the right signal distributing induction device and the left signal distributing induction device have the same configurations except that the directions of the winding of their wires around the cores are opposite.

Figure 7:
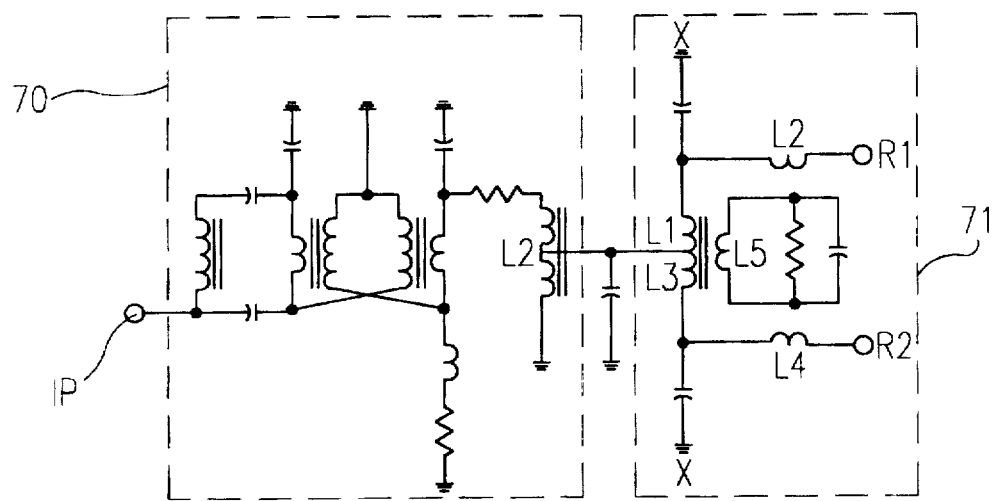
FIG. 7 is a circuit diagram of two-path diverging output circuit according to the above preferred embodiment of the present invention.
Figure 11:
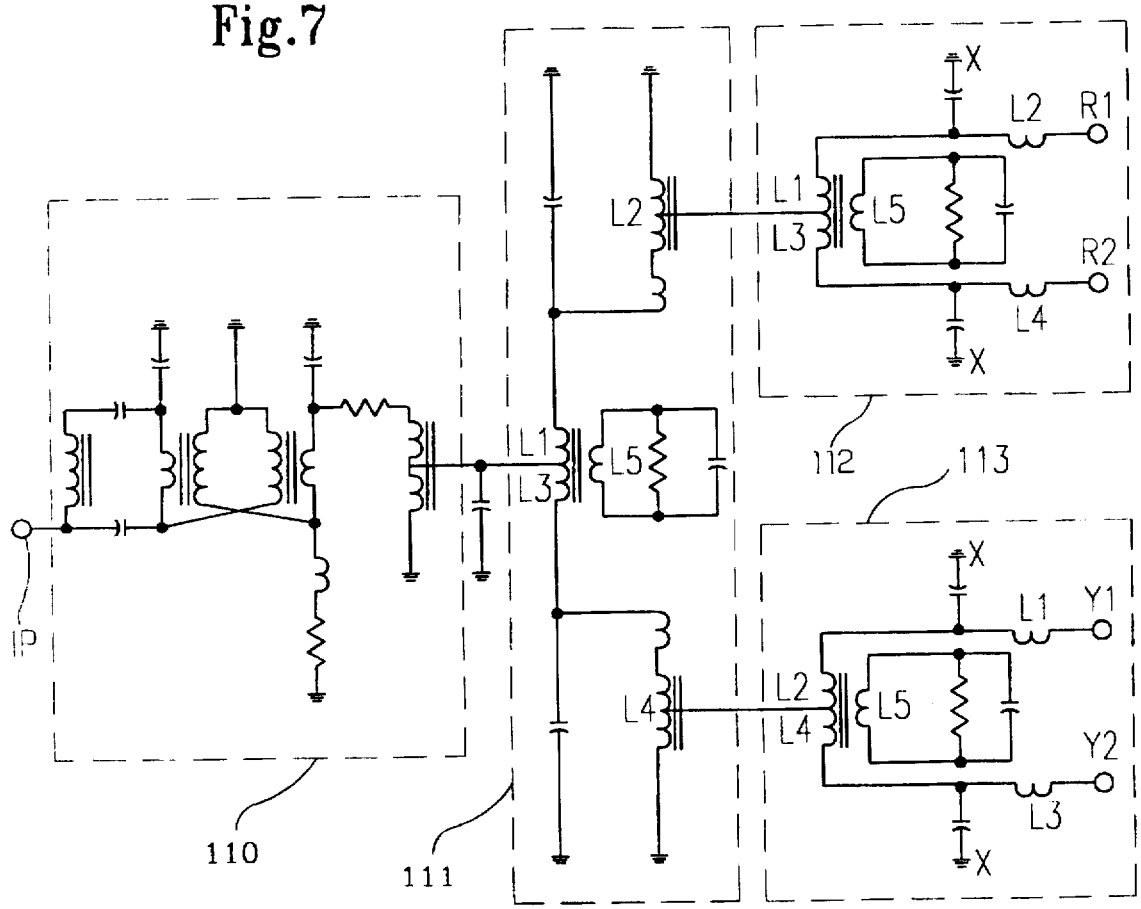
FIG. 11 is a circuit diagram of four-path diverging output circuit according to the above preferred embodiment of the present invention.

In practice, when the induction device for high radio frequency signal distributor of the present invention is applied to two-path diverging output circuit (as shown in FIG. 7) and four-path diverging output circuit (as shown in FIG. 11), the present invention results good performance according to the experimental data as shown in FIG. 7 and FIG. 11 even that the transmission frequency is as high as 1000 MHz.

Figure 8:
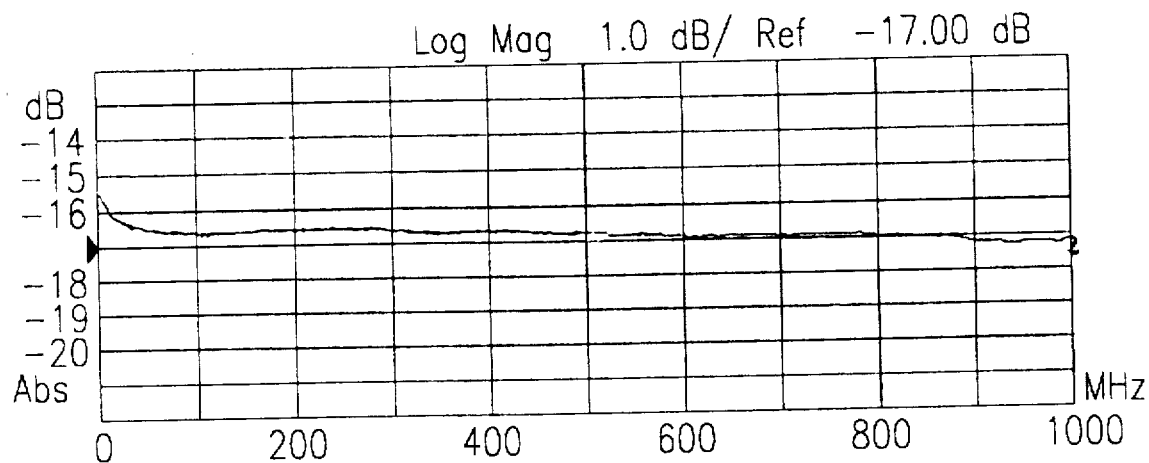
FIG. 8 is a frequency spectrum of the two-path diverging output circuit according to the above preferred embodiment of the present invention.
Figure 9:
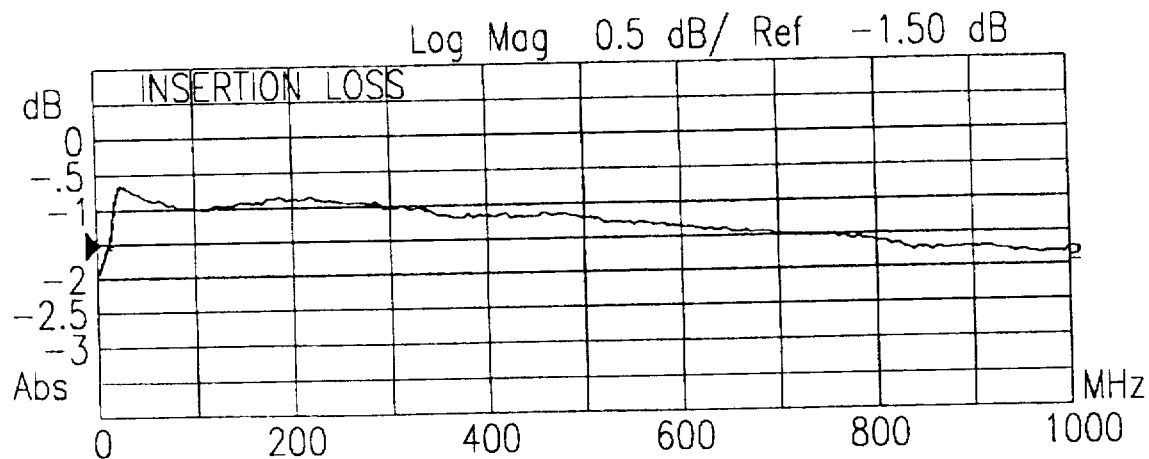
FIG. 9 is an insertion loss frequency spectrum of the two-path diverging output circuit according to the above preferred embodiment of the present invention.
Figure 10:
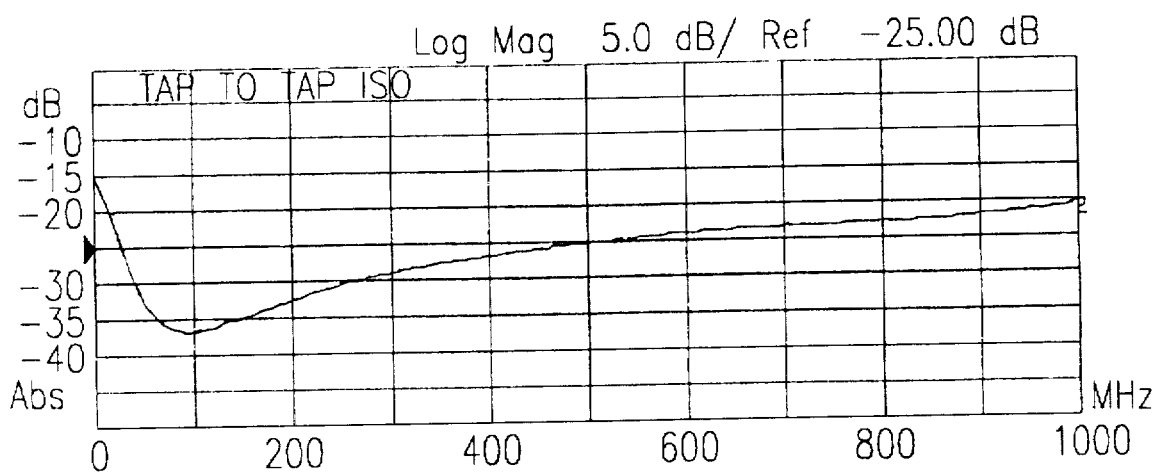
FIG. 10 is a tap-to-tap isolation loss frequency spectrum of the two-path diverging output circuit according to the above preferred embodiment of the present invention.

Referring to FIG. 7, a two-path diverging output circuit is illustrated, which comprises an input signal isolation circuit 70 and the signal distributing induction device 71 of the present invention. (Since the conventional input signal isolation circuit 70 is not the subject matter of the present invention, it is not described here in details.) The input signal isolation circuit 70 detects the high radio frequency signal from input port IP and sends the inputting high radio frequency signal detected to the signal distributing induction device 71 of the present invention, thereby forming the two paths of diverging output ports, namely the first output port R1 and the second output port R2. FIGS. 8 to 10 show the operational data of the present invention and demonstrate its effectiveness.

As shown in FIG. 8, a two-path diverging output frequency spectrum is illustrated. The frequency spectrum curve is very smooth and nearly forms a horizontal line in the high frequency range from 600 MHz to 1000 MHz. The variation in absorbance range is about 1 dB and the performance of the diverging output ports in high frequency can be mantained in good condition and therefore the present invention is suitable for use in high radio frequency.

As shown in FIG. 9, an insertion loss frequency spectrum of two-path diverging output is illustrated, which represents the influence between the input port IP and output ports R1, R2. According to the frequency spectrum, the two-path insertion loss absorbance is about 0.2 dB at 600 MHz, indicating there is only a small influence to such system.

As shown in FIG. 10, a tap-to-tap isolation loss frequency spectrum of diverging output ports of the two-path diverging output circuit is illustrated, representing the interrelated influence of the two diverging output ports R1 and R2. The absorbance does not increase markedly above 600 MHz and only reaches about 5 dB even at 1000 MHz, indicating very good performance.

Figure 12:
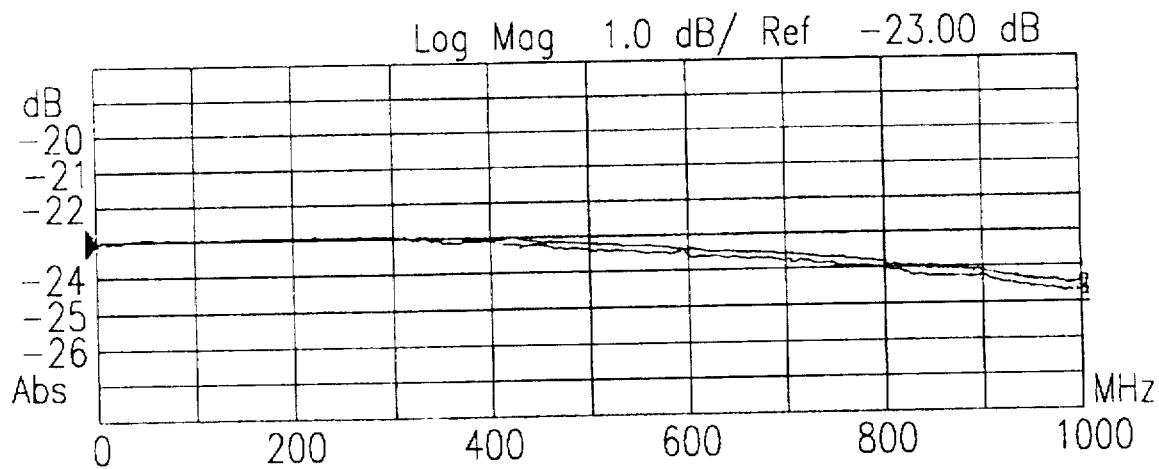
FIG. 12 is a frequency spectrum of the four-path diverging output circuit according to the above preferred embodiment of the present invention.
Figure 13:
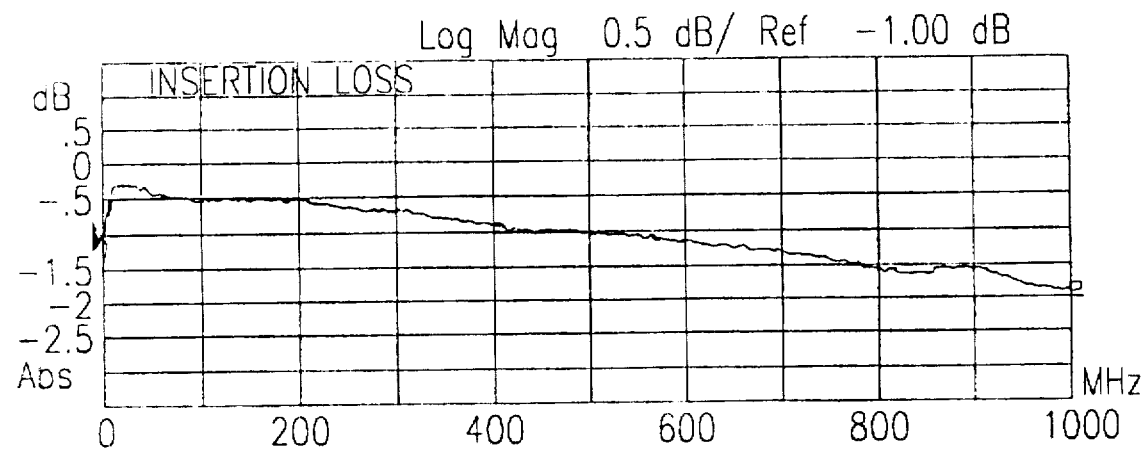
FIG. 13 is an insertion loss frequency spectrum of the four-path diverging output circuit according to the above preferred embodiment of the present invention.
Figure 14:
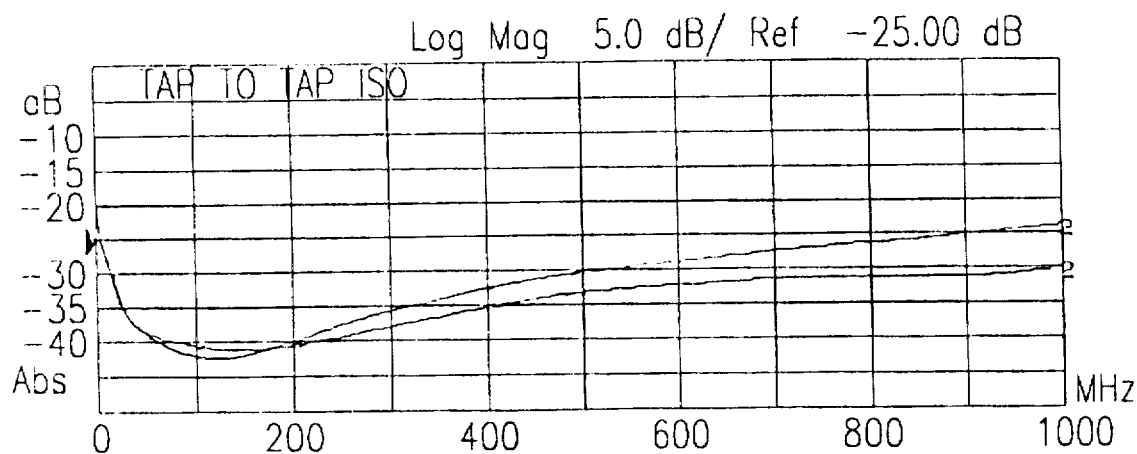
FIG. 14 is a tap-to-tap isolation loss frequency spectrum of the four-path diverging output circuit according to the above preferred embodiment of the present invention.

Referring to FIG. 11, a four-path diverging output circuit is illustrated, which comprises input signal isolation circuit 110 and a plurality of signal distributing induction devices 111, 112 and 113. (Since the conventional input signal isolation circuit 110 is not the subject matter of the present invention, it is not described here in details.) The input signal isolation circuit 110 detects high radio frequency signal from input port IP. The four-path diverging output is achieved by diverging the input signal sent from the input signal isolation circuit 110 with the first stage signal distributing induction device 111 to form two paths of diverging output signals which are further diverged by the second stage signal distributing induction devices 112 and 113 to form four diverging output ports respectively, namely the first diverging output port R1, the second diverging output port R2, the third diverging output port Y1, and the fourth diverging output port Y2, in which the second signal distributing induction device 112 is a right signal distributing induction device and the third signal distributing induction device 113 is a left signal distributing induction device as disclosed above. FIGS. 12 to 14 show the operational data of the present invention and demonstrate its effectiveness.

As shown in FIG. 12, a four-path diverging output frequency spectrum is illustrated. The frequency spectrum curve is very smooth and nearly forms a horizontal line in the high frequency range from 600 MHz to 1000 MHz. The variation in absorbance range is about 1.5 dB and the performance of the diverging output ports in high frequency can be mantained in good condition and therefore the present invention is suitable for use in high radio frequency.

As shown in FIG. 13, an insertion loss frequency spectrum of four-path diverging output is illustrated, which represents the influence between the input port IP and output ports R1, R2, Y1, and Y2. According to the frequency spectrum, the two-path insertion loss absorbance is about 0.8 dB at 1000 MHz, indicating there is only a small influence to such system.

As shown in FIG. 14, a tap-to-tap isolation loss frequency spectrum of diverging output ports of the four-path diverging output circuit is illustrated, representing the interrelated influence of the diverging output ports R1, R2, Y1, and Y2. Even the frequency spectrum curve is at 1000 MHz, there is no influence between the output ports in general or only reaches 6 dB in maximum, indicating very good performance.

I claim:

1. An induction device for high radio frequency signal distributor, comprising:

an insulator which is a piece of insulating card;

a pair of conductive cores, each of said conductive cores having a right bore, a left bore and a winding portion positioned between said right bore and said left bore, said pair of cores being symmetrically adhered to two opposite sides of said insulator; and a plurality of enamel copper wires which are intertwined around said pair of cores to define five inductors, said first enamel copper wire being wound about said winding portion first core so as to define said first inductor, said second enamel copper wire being wound about said first core so as to define said second inductor, said third enamel copper wire being wound about said winding portion of said second core so as to define said third inductor, said fourth enamel copper wire being wound about said winding portion of said second core so as to define said fourth inductor, said fifth enamel copper wire being wound about said winding portion of said second core so as to define said fifth inductor, and other ends of said first, second, third, and fourth enamel copper wires being twisted together to form a terminal end.

2. An induction device for high radio frequency signal distributor as recited in claim 1, in which said first wire is wound about said winding portion of said first core for 0.5 round.

3. An induction device for high radio frequency signal distributor as recited in claim 1, in which said second wire is wound about said winding portion of said first core for 2.5 rounds.

4. An induction device for high radio frequency signal distributor as recited in claim 1, in which said third wire is wound about said winding portion of said second core for 1.5 rounds.

5. An induction device for high radio frequency signal distributor as recited in claim 1, in which said fourth wire is wound about said winding portion of said second core for 1.5 rounds.

6. An induction device for high radio frequency signal distributor as recited in claim 1, in which said fifth wire is wound about said winding portion of said second core for 1.5 rounds.

7. An induction device for high radio frequency signal distributor as recited in claim 1, in which said induction device for high radio frequency signal distributor acts as a right signal distributing induction device when it is incorporated on a right side of said high radio frequency signal distributor.

8. An induction device for high radio frequency signal distributor as recited in claim 7, in which said first enamel copper wire penetrates said left bore of said first core and then winds around said winding portion of said first core for 0.5 round with the other end of said first wire intertwining with said terminal end to form said first inductor, said second enamel copper wire penetrates said right bore of said first core and then winds around said winding portion of said first core for 2.5 rounds with the other end of said second wire intertwining with said terminal end to form said second inductor, said third enamel copper wire penetrates said left bore of said second core and then winds around said winding portion of said second core for 1.5 rounds with the other end of said third wire intertwining with said terminal end to form said third inductor, said fourth enamel copper wire penetrates said right bore of said second core and then winds around said winding portion of said second core for 1.5 rounds with the other end of said fourth wire intertwining with said terminal end to form said fourth inductor, and said fifth enamel copper wire penetrates said right bore of said second core and then winds around said winding portion of said second core for 1.5 rounds with the other end of said fifth wire extending out of said second core via its said left bore to form said fifth inductor.

9. An induction device for high radio frequency signal distributor as recited in claim 1, in which said induction device for high radio frequency signal distributor acts as a left signal distributing induction device when it is incorporated on the left side of said high radio frequency signal distributor.

10. An induction device for high radio frequency signal distributor as recited in claim 9, in which said first enamel copper wire penetrates said right bore of said first core and then winds around said winding portion of said first core for 0.5 round with the other end of said first wire intertwining with said terminal end to form said first inductor, said second enamel copper wire penetrates said left bore of said first core and then winds around said winding portion of said first core for 2.5 rounds with the other end of said second wire intertwining with said terminal end to form said second inductor, said third enamel copper wire penetrates said right bore of said second core and then winds around said winding portion of said second core for 1.5 rounds with the other end of said third wire intertwining with said terminal end to form said third inductor, said fourth enamel copper wire penetrates said left bore of said second core and then winds around said winding portion of said second core for 1.5 rounds with the other end of said fourth wire intertwining with said terminal end to form said fourth inductor, and said fifth enamel copper wire penetrates said left bore of said second core and then winds around said winding portion of said second core for 1.5 rounds with the other end of said fifth wire extending out of said second core via its said right bore to form said fifth inductor.

11. An induction device for high radio frequency signal distributor as recited in claim 1, in which said signal distributing induction is incorporated with an input signal isolation circuit which detects the high radio frequency signal from an input port and sends said inputting high radio frequency signal detected to said signal distributing induction device, thereby forming two paths of diverging output ports.

12. An induction device for high radio frequency signal distributor, comprising a first stage signal distributing induction device and two second stage signal distributing induction devices which are incorporated with an input signal isolation circuit, in which said input signal isolation circuit detects high radio frequency signal from an input port and said detected high radio frequency signal is sent to said first stage signal distributing induction to form two paths of diverging output signals which are further diverged by said second stage signal distributing induction devices to form four diverging output ports, wherein one of the second stage signal distributing induction device is a right signal distributing induction device and the other second stage signal distributing induction device is a left signal distributing induction device;

each of said signal distributing induction devices comprising an insulator which is a piece of insulating card;

a pair of conductive cores, each of said conductive cores having a right bore, a left bore and a winding portion positioned between said right bore and said left bore, said pair of cores being symmetrically adhered to two opposite sides of said insulator; and a plurality of enamel copper wires which are intertwined around said pair of cores to define five inductors; said first enamel copper wire being wound about said winding portion first core so as to define said first inductor, said second enamel copper wire being wound about said first core so as to define said second inductor, said third enamel copper wire being wound about said winding portion of said second core so as to define said third inductor, said fourth enamel copper wire being wound about said winding portion of said second core so as to define said fourth inductor, said fifth enamel copper wire being wound about said winding portion of said second core defining said fifth inductor, and other ends of said first, second, third, and fourth enamel copper wires being twisted together to form a terminal end;

said right signal distributing induction device having said first enamel copper wire penetrating said left bore of said first core and then winding around said winding portion of said first core for 0.5 round with the other end of said first wire intertwining with said terminal end to form said first inductor; said second enamel copper wire penetrating said right bore of said first core and then winding around said winding portion of said first core for 2.5 rounds with the other end of said second wire intertwining with said terminal end to form said second inductor; said third enamel copper wire penetrating said left bore of said second core and then winding around said winding portion of said second core for 1.5 rounds with the other end of said third wire intertwining with said terminal end to form said third inductor; said fourth enamel copper wire penetrating said right bore of said second core and then winding around said winding portion of said second core for 1.5 rounds with the other end of said fourth wire intertwining with said terminal end to form said fourth inductor; said fifth enamel copper wire penetrating said right bore of said second core and then winding around said winding portion of said second core for 1.5 rounds with the other end of said fifth wire extending out of said second core via its said left bore to form said fifth inductor; and said left signal distributing induction device having said first enamel copper wire penetrating said left bore of said first core and then winding around said winding portion of said first core for 0.5 round with the other end of said first wire intertwining with said terminal end to form said first inductor; said second enamel copper wire penetrating said right bore of said first core and then winding around said winding portion of said first core for 2.5 rounds with the other end of said second wire intertwining with said terminal end to form said second inductor; said third enamel copper wire penetrating said left bore of said second core and then winding around said winding portion of said second core for 1.5 rounds with the other end of said third wire intertwining with said terminal end to form said third inductor; said fourth enamel copper wire penetrating said right bore of said second core and then winding around said winding portion of said second core for 1.5 rounds with the other end of said fourth wire intertwining with said terminal end to form said fourth inductor; said fifth enamel copper wire penetrating said right bore of said second core and then winding around said winding portion of said second core for 1.5 rounds with the other end of said fifth wire extending out of said second core via its said left bore to form said fifth inductor.

* * * * *